(12) United States Patent
Yi

(10) Patent No.: US 10,340,882 B2
(45) Date of Patent: Jul. 2, 2019

(54) BULK ACOUSTIC WAVE FILTER

(71) Applicant: SAMSUNG ELECTRO-MECHANICS CO., LTD., Suwon-si (KR)

(72) Inventor: Sang Hyun Yi, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 44 days.

(21) Appl. No.: 15/615,088

(22) Filed: Jun. 6, 2017

(65) Prior Publication Data
US 2018/0006632 A1 Jan. 4, 2018

(30) Foreign Application Priority Data

Jul. 1, 2016 (KR) .................. 10-2016-0083572

(51) Int. Cl.
H03H 9/10 (2006.01)
H03H 9/54 (2006.01)
H03H 9/13 (2006.01)
H03H 9/56 (2006.01)
H03H 9/05 (2006.01)

(52) U.S. Cl.
CPC .......... H03H 9/105 (2013.01); H03H 9/0538 (2013.01); H03H 9/1014 (2013.01); H03H 9/13 (2013.01); H03H 9/542 (2013.01); H03H 9/564 (2013.01)

(58) Field of Classification Search
CPC ........ H03H 9/542; H03H 9/564; H03H 9/105; H03H 9/13
USPC .................................. 333/133, 187
See application file for complete search history.

(56) References Cited

U.S. PATENT DOCUMENTS

| 7,236,066 B2* | 6/2007 | Ebuchi | H03H 3/02 257/1 |
| 2003/0058066 A1 | 3/2003 | Taniguchi et al. | |
| 2005/0012571 A1 | 1/2005 | Song et al. | |
| 2006/0001123 A1* | 1/2006 | Heck | B81C 1/0023 257/528 |
| 2011/0148547 A1* | 6/2011 | Zhang | H03H 9/02118 333/187 |

FOREIGN PATENT DOCUMENTS

JP 2002-141771 A 5/2002
KR 10-2004-0103587 A 12/2004

* cited by examiner

Primary Examiner — Robert J Pascal
Assistant Examiner — Jorge L Salazar, Jr.
(74) Attorney, Agent, or Firm — NSIP Law

(57) ABSTRACT

A bulk acoustic wave filter includes a substrate, a first electrode and a second electrode disposed on the substrate, a piezoelectric layer including a piezoelectric material, the piezoelectric layer disposed between the first and second electrodes, and a passive element disposed on one surface of a housing. The housing is coupled to the substrate to accommodate the piezoelectric layer, the first electrode and the second electrode.

15 Claims, 4 Drawing Sheets

BULK ACOUSTIC WAVE FILTER

CROSS-REFERENCE TO RELATED APPLICATION(S)

This application claims the benefit under 35 USC 119(a) of Korean Patent Application No. 10-2016-0083572, filed on Jul. 1, 2016 in the Korean Intellectual Property Office, the entire disclosure of which is incorporated herein by reference for all purposes.

BACKGROUND

1. Field

The present disclosure relates to a bulk acoustic wave filter.

2. Description of Related Art

With the growth of wireless mobile communications technology, various high frequency components are needed that may efficiently transmit information in a limited frequency band. Among high frequency components, filters, transmitters, receivers, and duplexers are key components used in wireless mobile communications technology.

A component that is widely used among the filters, transmitters, receivers, and duplexers is a bulk acoustic wave filter (BAW). The size and unit price of the bulk acoustic wave filter are typically significant factors considered when choosing high frequency components. Therefore, in order to reduce the overall size and unit price of the high frequency components, the size and unit price of the bulk acoustic wave filter need to be further reduced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave filter includes a substrate, a first electrode and a second electrode disposed on the substrate, a piezoelectric layer including a piezoelectric material, the piezoelectric layer disposed between the first and second electrodes, and a passive element disposed on one surface of a housing. The housing is coupled to the substrate to encapsulate the piezoelectric layer, the first electrode and the second electrode.

The bulk acoustic wave filter may further include a wiring electrically connecting the passive element and the first electrode or the second electrode to each other.

The passive element may be disposed on a surface of the housing facing the substrate.

The housing may include a cover and a coupling part attached to the cover and the substrate, between the cover and the substrate, to seal a space in which the piezoelectric layer and the first and second electrodes are disposed.

The bulk acoustic wave filter may further include a second piezoelectric layer having one surface disposed on the second electrode, and a third electrode disposed on the other surface of the second piezoelectric layer. One surface of each of the first and third electrodes may be in contact with the substrate.

The bulk acoustic wave filter may further include a first via formed on the other surface of the first electrode, a second via formed on one surface of the second electrode, and third and fourth vias formed on the substrate.

The passive element may include a capacitor electrically connected to the first via and the third via, and an inductor electrically connected to the second via and the fourth via.

The passive element may include a capacitor disposed on one of inner side and outer side of the housing, and an inductor disposed on other one of the inner side and the outer side of the housing.

The bulk acoustic wave filter may further include an active element mounted on the substrate.

In another general aspect, a bulk acoustic wave filter includes a member having a hollow polyhedral shape, a piezoelectric layer disposed on one of inner sides of the member and including a piezoelectric material, first and second electrodes disposed on both surfaces of the piezoelectric layer, and a passive element disposed on the other of the inner sides of the member.

In another general aspect, a bulk acoustic wave filter includes a first electrode and a second electrode disposed on a substrate, a piezoelectric layer including a piezoelectric material, the piezoelectric layer disposed between the first and second electrodes, and a first passive element disposed on a first inner surface of a housing. The housing is coupled to the substrate to encapsulate the piezoelectric layer, the first electrode and the second electrode.

The bulk acoustic wave filter may further include a second passive element disposed on a second inner surface of the housing, the second inner surface being different from the first inner surface.

The bulk acoustic wave filter may further include a second passive element disposed on an outer surface of the housing.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
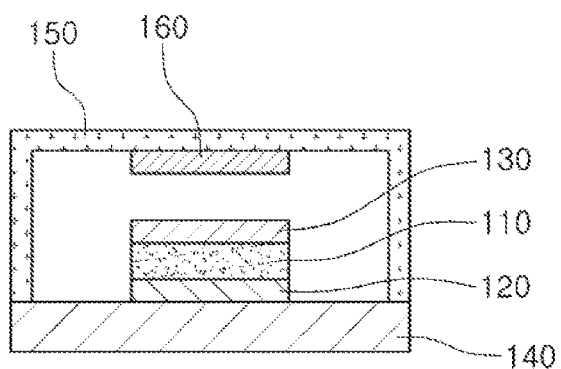
FIG. 1 is a view illustrating an example of a bulk acoustic wave filter.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating an example of a bulk acoustic wave filter.

Referring to FIG. 1, a bulk acoustic wave filter includes a piezoelectric layer 110, a first electrode 120, a second electrode 130, a substrate 140, a housing 150, and a passive element 160.

The piezoelectric layer 110 includes a piezoelectric material that converts mechanical energy into electrical energy. For example, the piezoelectric layer 110 may include zinc oxide (ZnO) or aluminum oxide (AlN) as the piezoelectric material, and is deposited as a thin film on the electrode using a high frequency magnetron sputtering method.

The first electrode 120 and the second electrode 130 are disposed on both surfaces of the piezoelectric layer 110, respectively. The first electrode 120 and the second electrode 130 may be formed of a material having high conductivity to allow an electric signal having a high frequency to pass through the electrodes.

As the frequency of the electric signal is close to a specific frequency, a bulk acoustic wave due to a resonance phenomenon occurs on a surface of the piezoelectric layer 110. The bulk acoustic wave serves as a medium that passes the signal between the first electrode 120 and the second electrode 130. Therefore, the first electrode 120, the second electrode 130, and the piezoelectric layer 110 serves as the filter that selectively passes the electric signal having a specific frequency.

The first electrode 120 is disposed on the substrate 140. For example, the substrate 140 may be a printed circuit board including a high frequency circuit, a conducting wire, a ground, and a via. The components included in the printed circuit board may be electrically connected to the first electrode.

The housing 150 may be physically coupled to the substrate 140 to accommodate or encapsulate the piezoelectric layer 110, the first electrode 120 and the second electrode 130. The housing refers to an enclosure used to protect an encapsulated or accommodated object from physical/electrical impact or used to reduce electromagnetic interference influence on the encapsulated object.

For example, the housing 150 may include a metal layer to secure electromagnetic shielding characteristics. Here, both surfaces of the metal layer may be covered with an insulating ceramic such as aluminum oxide or a synthetic resin.

The accommodated or encapsulated objects of the housing 150 may be designed to precisely and efficiently filter high frequency signals. Thus, the encapsulated objects of the housing 150 are less susceptible to external physical/electrical impact or influence.

Therefore, the housing 150 provides an accommodating space that is significantly greater than a size and design of the encapsulated objects. That is, the margin space defined within the accommodating space of the housing 150 is relatively large when compared to the encapsulated objects. In a case in which the piezoelectric layer 110, the first electrode 120 and the second electrode 130 are formed of thin film, most of the margin space may be a space above the second electrode 130.

The passive element 160 is disposed to be in contact with the housing 150 to occupy the margin space. In the case in which the piezoelectric layer 110, the first electrode 120 and the second electrode 130 are formed of thin film, the passive element 160 is disposed on a ceiling of the housing 150. As a result, the margin space is efficiently utilized.

For example, the passive element 160 may be a capacitor and/or an inductor. The passive element 160 may be electrically connected to the first electrode 120 and the second electrode 130 to filter electric signals having high frequency, or may be electrically connected to an high frequency circuit of the substrate 140, to assist in operation of generating, amplifying, synthesizing, and transmitting electric signals having high frequency.

In a case in which the passive element 160 assists in the high frequency element or the high frequency circuit, the size of the passive element 160 occupies a relatively large portion of the overall size of the bulk acoustic wave filter. If the passive element 160 is disposed outside the housing 150, the overall size of the bulk acoustic wave filter may be increased.

However, since the bulk acoustic wave filter, according to an example, has the passive element 160 disposed in the margin space in the housing 150, the overall size and a unit price of the bulk acoustic wave filter is reduced.

Figure 2:
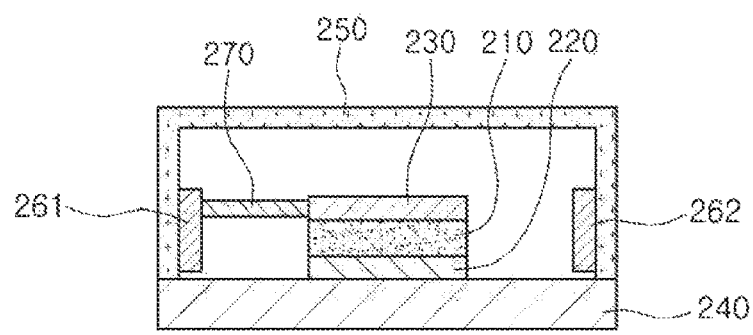
FIG. 2 is a view illustrating an example of a bulk acoustic wave filter.

FIG. 2 is a view illustrating an example of a bulk acoustic wave filter.

Referring to FIG. 2, a bulk acoustic wave filter according to an example in the present disclosure includes a piezoelectric layer 210, a first electrode 220, a second electrode 230, a substrate 240, a housing 250, a capacitor 161, an inductor 162, and a wiring 270. The piezoelectric layer 210, the first electrode 220, the second electrode 230, the substrate 240, and the housing 250 may be the same as the piezoelectric layer, the first electrode, the second electrode, the substrate, and the housing, which are respectively illustrated in FIG. 1.

The capacitor 161, which is a passive element, is disposed on one side inside surface of the housing 250. The inductor 262, which is another passive element, is disposed on the other side inside surface of the housing 250.

Based on the configurations of the bulk acoustic wave filter, most of the margin space inside the housing 250 may be a space of a side surface of the piezoelectric layer 210. Therefore, the capacitor 261 and the inductor 262 are disposed on the side inside surface of the housing 250.

The wiring 270 electrically connect the capacitor 261 and the second electrode 230 to each other, and the capacitor 261 may be electrically connected to the substrate 240. Therefore, the wiring 270 forms an electrical path to the substrate 240 and the second electrode 230.

As a result, the second electrode 230 may not be physically connected to the substrate 240. In a case in which the second electrode 230 is not required to be physically connected to the substrate 240, the degree of freedom of design of the piezoelectric layer 210, the first electrode 220 and the second electrode 230 is improved. As a result, the piezoelectric layer 210, the first electrode 220 and the second electrode 230 are more efficiently designed.

Figure 3:
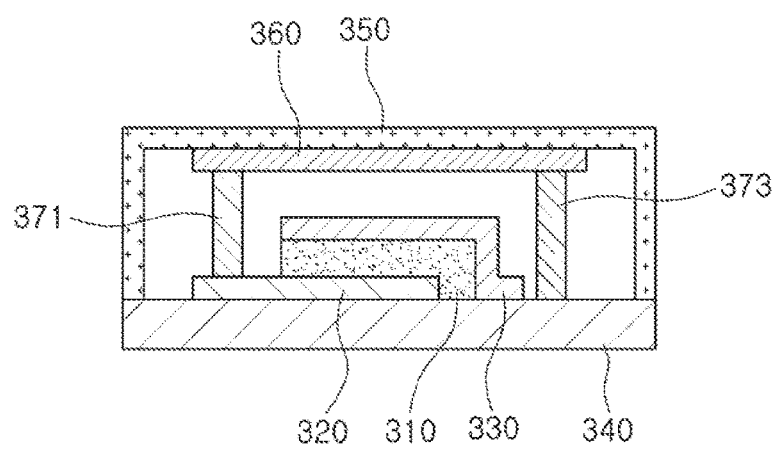
FIG. 3 is a view illustrating an example of a bulk acoustic wave filter.

FIG. 3 is a view illustrating an example of a bulk acoustic wave filter in the present disclosure.

Referring to FIG. 3, the bulk acoustic wave filter includes a piezoelectric layer 310, a first electrode 320, a second electrode 330, a substrate 340, a housing 350, a passive element 360, a first via 371, and a third via 373.

The second electrode 330 has a zigzag shape to physically/electrically connect to the substrate 340. Correspondingly, the piezoelectric layer 310 also has a zigzag shape.

In addition, the first via 371 is formed on the first electrode 320. The first via 371 electrically connects the first electrode 320 and the passive element 360 to each other.

In addition, the third via 373 is formed on the substrate 340 and electrically connects the substrate 340 and the passive element 360 to each other.

As a result connections, an electrical path between the substrate 340, the second electrode 330, the piezoelectric layer 310, the first electrode 320, the first via 371, the passive element 360, the third via 373, and the substrate 340 is formed in three dimensions. The three dimensional path improves the degree of freedom of the design of the bulk acoustic wave filter.

Figure 4A:
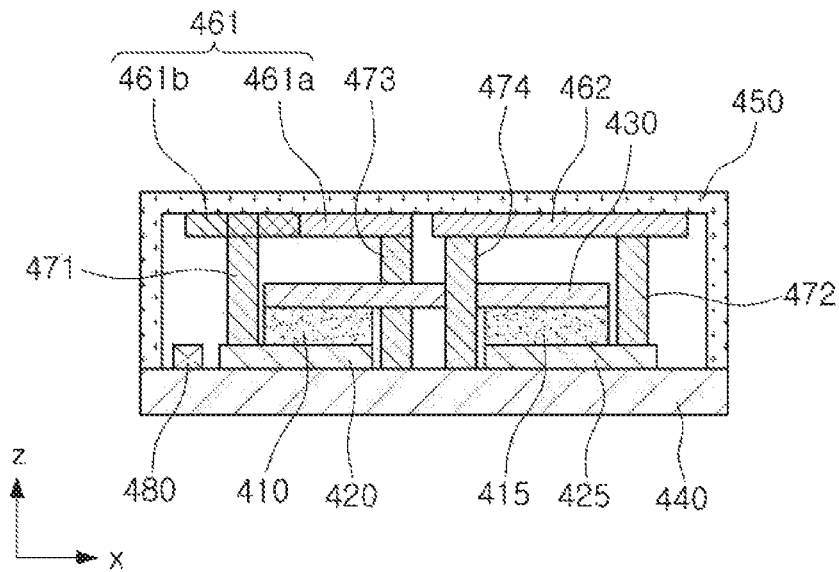
FIG. 4A is a side view example of the bulk acoustic wave filter.

FIG. 4A is a side view example of the bulk acoustic wave filter in the present disclosure.

Figure 4B:
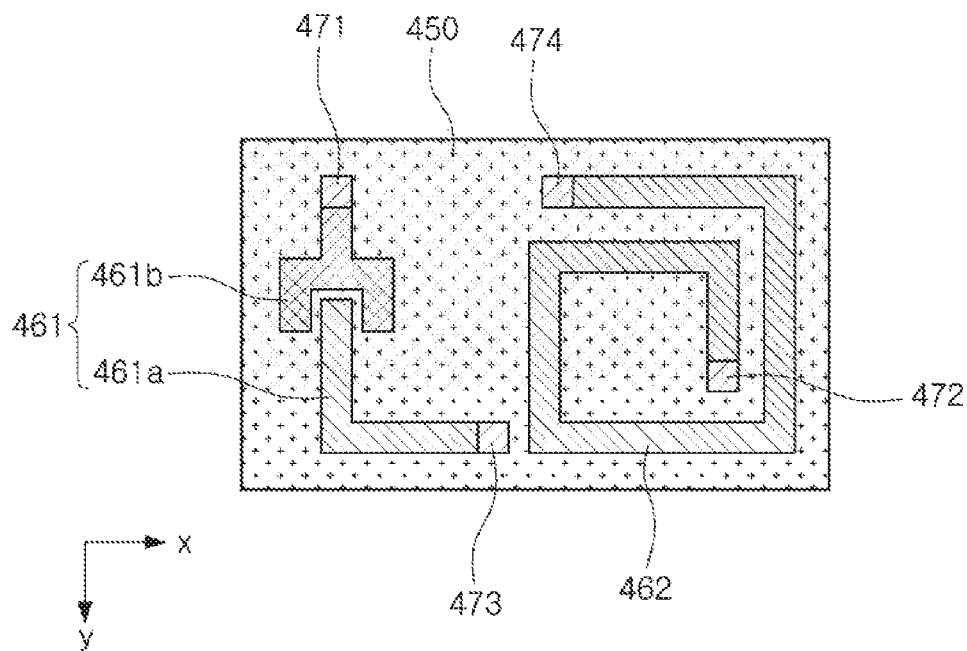
FIG. 4B is a top view example of the bulk acoustic wave filter.

FIG. 4B is a top view of an example of the bulk acoustic wave filter in the present disclosure.

Referring to FIGS. 4A and 4B, the bulk acoustic wave filter includes a piezoelectric layer 410, a second piezoelectric layer 415, a first electrode 420, a third electrode 425, a second electrode 430, a substrate 440, a housing 450, a capacitor 461, an inductor 462, a first via 471, a second via 472, a third via 473, a fourth via 474, and an active element 480.

The second piezoelectric layer 415 is disposed on a lower surface of the second electrode 430 and includes a piezoelectric material. The method of implementing the second piezoelectric layer 415 may be the same as that of the piezoelectric layer 410.

The third electrode 425 is disposed on a lower surface of the second piezoelectric layer 415. The method of implementing the third electrode 425 may be the same as that of the first electrode 420.

Based on the configuration, electrical signal having a high frequency may be repeatedly generated from the piezoelectric layers.

The first via 471 is built on the first electrode 420. The first via 471 electrically connects the first electrode 420 to the capacitor 461.

The second via 472 is built on the third electrode 425. The second via 472 electrically connects the third electrode 425 to the inductor 462.

In addition, the second and fourth vias 472 and 474 is built on the substrate 440. The second via 472 electrically connects the substrate 440 to the capacitor 461, and the fourth via 474 electrically connects the substrate 440 to the inductor 462.

As a result of the configuration, an electrical path is established between the substrate 440, the capacitor 461, the piezoelectric layer 510, the second piezoelectric layer 415, the inductor 462, and the substrate 440, and formed in three dimensions. The three dimensional path improves the degree of freedom when designing the bulk acoustic wave filter.

The capacitor 461 is implemented so that a first part 461a and a second part 461b are electrically coupled to each other. The inductor 462 is implemented to be wound around one surface of the housing 450.

Also, the active element 480 is mounted on the substrate 440 and may be an integrated circuit. The active element 480 executes a generation, amplification, synthesizing, and transmission of a high frequency electrical signal together with the capacitor 461 and/or the inductor 462.

Figure 5:
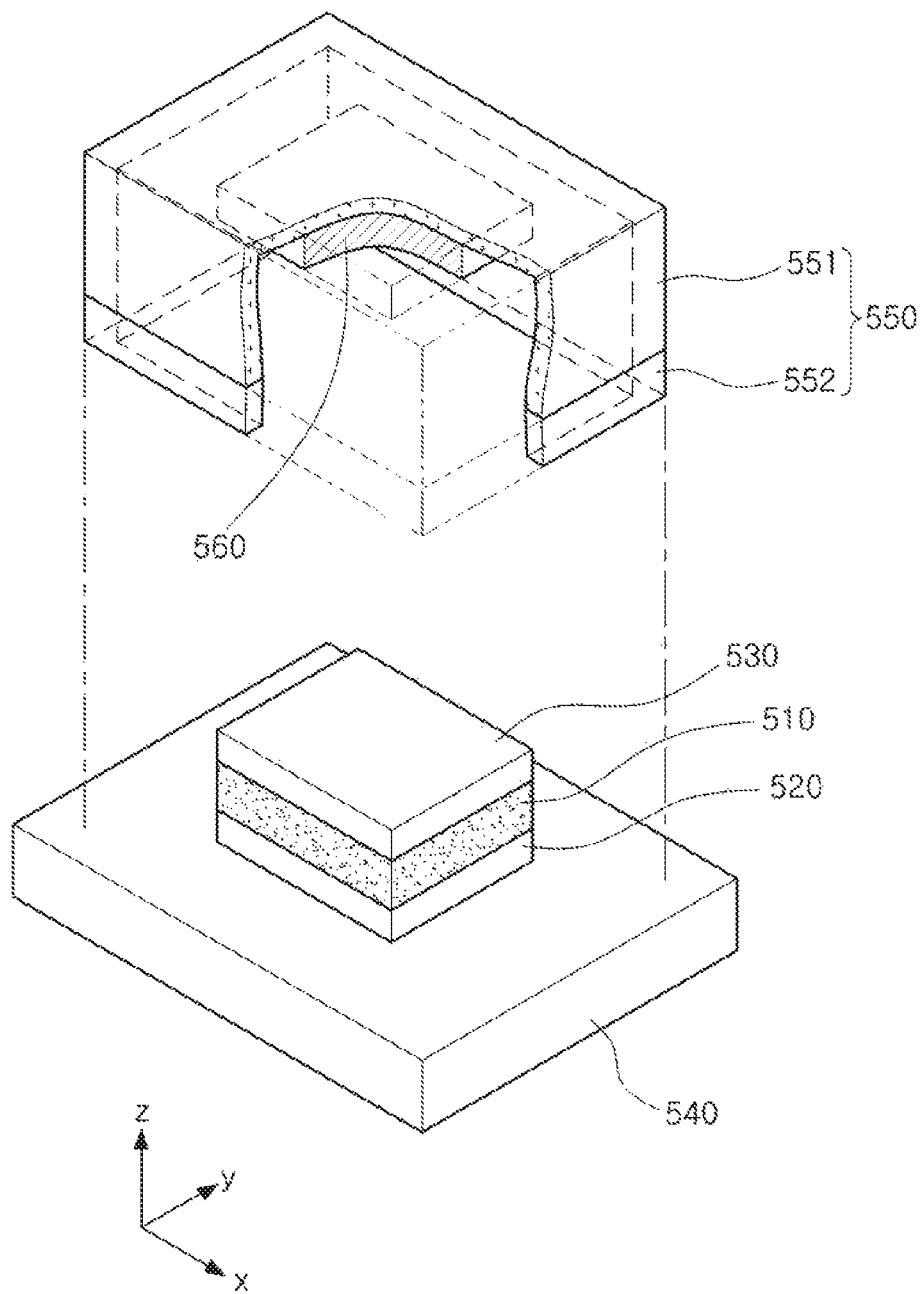
FIG. 5 is a perspective view illustrating an example of a substrate and a housing included in the bulk acoustic wave filter before being coupled to each other.

FIG. 5 is a perspective view illustrating an example of a substrate and a housing included in the bulk acoustic wave filter before being coupled to each other.

Referring to FIG. 5, a bulk acoustic wave filter according to an example in the present disclosure includes a piezoelectric layer 510, a first electrode 520, a second electrode 530, a substrate 540, a housing 550, and a passive element 560.

The housing 550 includes a cover 551 and a coupling part 552.

The coupling part 552 is coupled between the cover 551 and the substrate 540 to seal the space in which the piezoelectric layer 510, the first electrode 520 and the second electrode 530 are disposed.

For example, the coupling part 552 may include an adhesive material to be bonded to the substrate 540 and the substrate 540 may have a groove into which the coupling part 552 is inserted for a secured adhesion.

Figure 6:
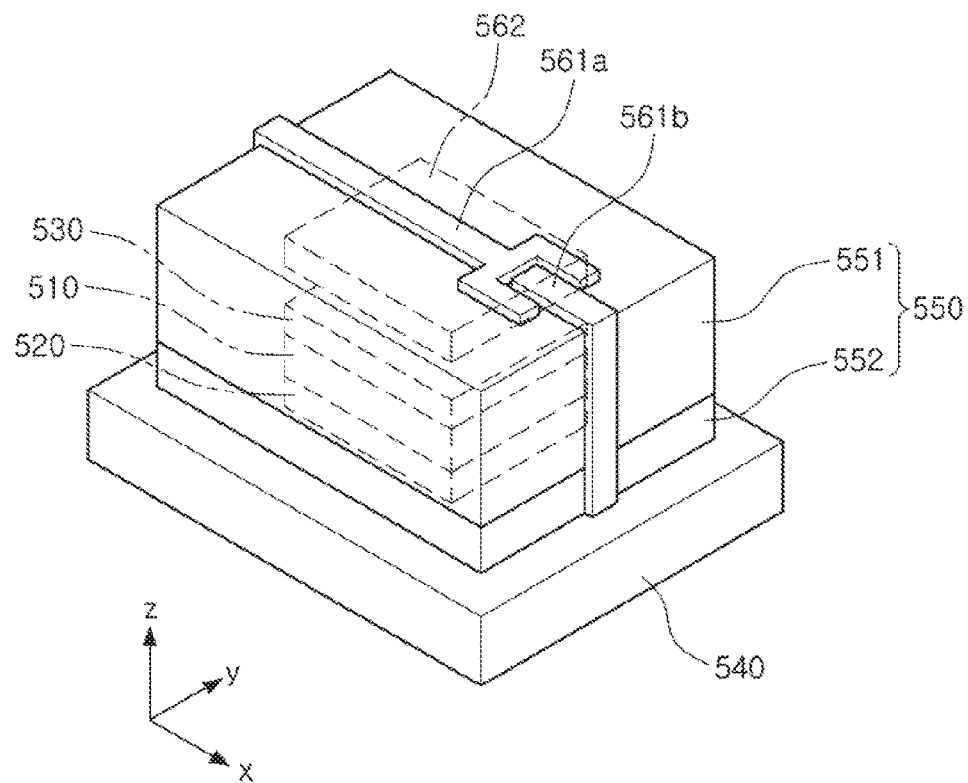
FIG. 6 is a perspective view illustrating an example of a substrate and a housing included in the bulk acoustic wave filter being coupled to each other.

FIG. 6 is a perspective view illustrating an example of a substrate and a housing included in the bulk acoustic wave filter being coupled to each other.

Referring to FIG. 6, a bulk acoustic wave filter includes a piezoelectric layer 510, a first electrode 520, a second electrode 530, a substrate 540, a housing 550, capacitors 561a and 561b, and an inductor 562.

The capacitors 561a and 561b are disposed on an outer side of the housing 550. For example, the capacitor 561a and 561b are extended to the substrate 540 along the outer surface of the housing 550.

The inductor 562 is disposed on an inner side of the housing 550. However, the capacitors 561a and 561a and the inductor 562, which are the passive elements, may all be disposed on the inner side of the housing 550 or on an outer side the housing 550.

In an example in which the passive element is disposed on the outer side of the housing 550, the passive element is not disposed on the substrate 540. As a result, an area in x and y axis directions of the substrate 540 may be reduced, and an inner margin space of the housing 550 may also be reduced in a z axis direction. Therefore, the size of the bulk acoustic wave filter is reduced.

In an example in which the passive element is disposed on the inner side of the housing 550, the inner margin space of the housing 550 may be utilized as an arrangement space for the passive element. Therefore, the size of the bulk acoustic wave filter is reduced.

In an example in which one of the capacitors 561a and 561b and the inductor 562 is disposed on the inner side of the housing 550 and the other is disposed on the outer side of the housing 550, the inner margin space of the housing 550 may be more efficiently utilized. For example, one of the capacitors 561a and 561b and the inductor 562 having a size similar to the size of the inner margin space of the housing 550 may be selectively disposed on the inner side of the housing 550.

In addition, in the example in which one of the capacitors 561a and 561b and the inductor 562 is disposed on the inner side of the housing 550 and the other is disposed on the outer side of the housing 550, the housing 550 may also serve to shield an electromagnetic wave between the capacitors 561a and 561b and inductor 562. As a result, high frequency characteristics of the high frequency circuit or the high frequency element which is electrically connected to the capacitors 561a and 561b and the inductor 562 is also be improved.

Figure 7:
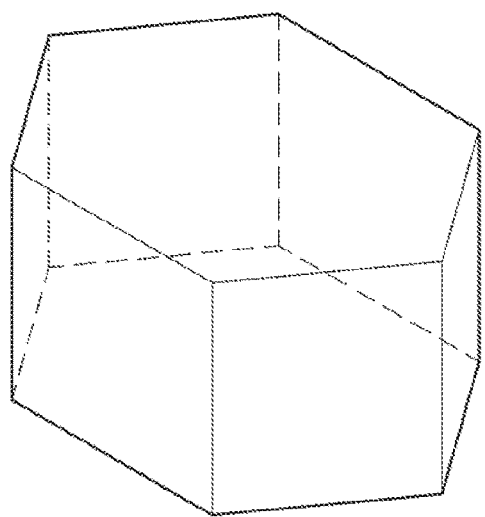
FIG. 7 is a perspective view illustrating an example of a member included in the bulk acoustic wave filter.

FIG. 7 is a perspective view illustrating an example of a member included in the bulk acoustic wave filter.

Referring to FIG. 7, the bulk acoustic wave filter according to an example in the present disclosure includes a member 645 having a polyhedral shape.

The passive element, the piezoelectric layer, and the first and second electrodes are disposed in the member 645, as described above with reference to FIGS. 1 through 6. The passive element may be disposed on a surface of the member 645 that's different from the surface on which the piezoelectric layer and the first and second electrodes are disposed, and may be electrically connected to the piezoelectric layer and the first and second electrodes through at least one via.

The member 645 may have a shape in which the substrate and the housing are coupled to each other to form a polyhedron, but is not limited thereto.

As set forth above, according to the examples in the present disclosure, the bulk acoustic wave filter efficiently uses space within its housing to reduce the size and the unit price of the bulk acoustic wave filter.

Further, the bulk acoustic wave filter may secure the electrical path between the electrode and the passive element to improve a degree of freedom of a design of the bulk acoustic wave filter.

As a non-exhaustive example only, a wireless mobile communication device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave filter, comprising:
a first electrode and a second electrode disposed on a substrate;
a piezoelectric layer comprising a piezoelectric material, the piezoelectric layer disposed between the first and second electrodes;
a housing comprising a passive element disposed on one surface thereof, wherein the housing is coupled to the substrate to accommodate the piezoelectric layer, the first electrode and the second electrode; and
a via disposed on a surface of the passive element and configured to electrically connect one of the first electrode, the second electrode, and the substrate to the passive element.

2. The bulk acoustic wave filter of claim 1, further comprising:
a wiring electrically connecting the passive element and the first electrode or the second electrode to each other.

3. The bulk acoustic wave filter of claim 1, wherein the passive element is disposed on a surface of the housing facing the substrate.

4. The bulk acoustic wave filter of claim 1, wherein the housing includes:
a cover; and
a coupling part coupled to the cover and the substrate, between the cover and the substrate, to seal a space in which the piezoelectric layer and the first and second electrodes are disposed.

5. The bulk acoustic wave filter of claim 1, further comprising:
a second piezoelectric layer having one surface disposed on the second electrode; and
a third electrode disposed on the other surface of the second piezoelectric layer,
wherein one surface of each of the first and third electrodes is in contact with the substrate.

6. The bulk acoustic wave filter of claim 5, wherein the via comprises a first, second, third and fourth via and,
the first via is formed on the other surface of the first electrode;
the second via is formed on one surface of the second electrode; and
the third and fourth vias are formed on the substrate.

7. The bulk acoustic wave filter of claim 6, wherein the passive element includes:
a capacitor connected to the first via and the third via; and
an inductor connected to the second via and the fourth via.

8. The bulk acoustic wave filter of claim 1, wherein the passive element includes:
a capacitor disposed on one of inner side and outer side of the housing; and
an inductor disposed on other one of the inner side and the outer side of the housing.

9. The bulk acoustic wave filter of claim 1, further comprising:
an active element mounted on the substrate.

10. A bulk acoustic wave filter, comprising:
a first electrode and a second electrode disposed on a substrate;
a piezoelectric layer comprising a piezoelectric material, the piezoelectric layer disposed between the first and second electrodes;
a first passive element disposed on a first inner surface of a housing, the housing being coupled to the substrate to encapsulate the piezoelectric layer, the first electrode and the second electrode; and
a via disposed on a surface of the first passive element and configured to electrically connect one of the first electrode, the second electrode, and the substrate to the first passive element.

11. The bulk acoustic wave filter of claim 10, further comprising:
a second passive element disposed on a second inner surface of the housing, the second inner surface being different from the first inner surface.

12. The bulk acoustic wave filter of claim 11, wherein the first passive element is a capacitor and the second passive element is an inductor, or vice versa.

13. The bulk acoustic wave filter of claim 10, further comprising a second passive element disposed on an outer surface of the housing.

14. The bulk acoustic wave filter of claim 13, wherein the first passive element is a capacitor and the second passive element is an inductor, or vice versa.

15. A bulk acoustic wave filter, comprising:
a first electrode and a second electrode disposed on a substrate;
a piezoelectric layer comprising a piezoelectric material, the piezoelectric layer disposed between the first and second electrodes;
a housing comprising a passive element disposed on one surface thereof, wherein the housing is coupled to the substrate to accommodate the piezoelectric layer, the first electrode and the second electrode;
a second piezoelectric layer having one surface disposed on the second electrode;
a third electrode disposed on the other surface of the second piezoelectric layer;
a first via formed on the other surface of the first electrode;
a second via formed on one surface of the second electrode; and
third and fourth vias formed on the substrate,
wherein one surface of each of the first and third electrodes is in contact with the substrate.

* * * * *